United States Patent
Trinn

(10) Patent No.: US 12,221,031 B2
(45) Date of Patent: Feb. 11, 2025

(54) STEERING COLUMN SWITCH FOR A MOTOR VEHICLE

(71) Applicant: KOSTAL Automobil Elektrik GmbH & Co. KG, Luedenscheid (DE)

(72) Inventor: Alexander Trinn, Luedenscheid (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 108 days.

(21) Appl. No.: 18/305,007

(22) Filed: Apr. 21, 2023

(65) Prior Publication Data

US 2023/0256898 A1 Aug. 17, 2023

Related U.S. Application Data

(63) Continuation of application No. PCT/EP2021/084231, filed on Dec. 3, 2021.

(30) Foreign Application Priority Data

Dec. 7, 2020 (DE) ..................... 10 2020 007 438.3

(51) Int. Cl.
*B60Q 1/14* (2006.01)
*H03K 17/97* (2006.01)

(52) U.S. Cl.
CPC .......... *B60Q 1/1469* (2013.01); *H03K 17/97* (2013.01)

(58) Field of Classification Search
CPC ........... B60K 2310/00; B60K 2310/20; H01H 3/32; H01H 15/00; H01H 21/54;
(Continued)

(56) References Cited

U.S. PATENT DOCUMENTS

2003/0001705 A1 1/2003 Sugiyama et al.
2008/0211609 A1* 9/2008 Ichimura .............. B60Q 1/1469
335/205
(Continued)

FOREIGN PATENT DOCUMENTS

CN 107452540 A 12/2017
DE 8112331 U1 9/1981
(Continued)

OTHER PUBLICATIONS

European Patent Office, International Search Report for International Application No. PCT/EP2021/084231, mailed Mar. 30, 2022.
(Continued)

*Primary Examiner* — Anthony R Jimenez
(74) *Attorney, Agent, or Firm* — Brooks Kushman P.C.

(57) ABSTRACT

A steering column switch includes a switch lever, a switch piece, a slide, a magnet, and a magnet sensor. The switch lever is pivotable in perpendicular directions. The switch piece is pivotable about the first axis. The switch lever has an end piece pivotably mounted in the switch piece so that the switch lever is pivotable about a second axis perpendicular to the first axis. The end piece bears a latching sleeve that is engageable into a detent cam at different positions. The slide is mounted on the switch piece so that the slide is linearly displaceable parallel to the first axis and follows switch lever movement about the second axis. The magnet and the magnet sensor are positionable relative to one another via switch lever movements. The magnet is connected to the slide and swivels with the switch piece as the switch piece swivels about the first axis.

8 Claims, 6 Drawing Sheets

(58) Field of Classification Search
CPC ....... H01H 2071/048; H01H 2221/014; H01H 2221/022; H01H 2221/016; H01H 2231/026; H03K 17/90; H03K 17/945; H03K 17/95; H03K 17/9505; H03K 17/97; B60Q 1/14; B60Q 1/1453; B60Q 1/1461; B60Q 1/1469; B60Q 1/1446; B60Q 1/1476; B60Q 1/26; B60Q 1/24; B60Q 1/34
USPC ...................................................... 200/61.27
See application file for complete search history.

(56) References Cited

U.S. PATENT DOCUMENTS

| 2009/0139850 | A1 | 6/2009 | Urakawa et al. |
| 2017/0140886 | A1 | 5/2017 | Saito et al. |

FOREIGN PATENT DOCUMENTS

| DE | 29901614 U1 | 4/1999 |
| DE | 69923511 T2 | 2/2006 |
| DE | 102011111871 A1 | 2/2013 |
| EP | 1270328 A2 | 1/2003 |
| JP | 2016012465 A | 1/2016 |

OTHER PUBLICATIONS

German Patent and Trademark Office, German Search Report for German Patent Application No. DE 10 2020 007 438.3 dated Nov. 9, 2021.

The International Bureau of WIPO, International Preliminary Report on Patentability for International Application No. PCT/EP2021/084231 issued Jun. 13, 2023.

* cited by examiner

STEERING COLUMN SWITCH FOR A MOTOR VEHICLE

CROSS-REFERENCE TO RELATED APPLICATIONS

This application is a continuation of International Application No. PCT/EP2021/084231, published in German, with an international filing date of Dec. 3, 2021, which claims priority to DE 10 2020 007 438.3, filed Dec. 7, 2020, the disclosure of which is hereby incorporated in its entirety herein.

TECHNICAL FIELD

The present invention relates to a steering column switch for a motor vehicle, the steering column switch including a switch lever that is pivotable in two mutually perpendicular directions and a switch piece that is mounted so as to be pivotable about a first axis, the switch lever being mounted in the switch piece so that the switch lever is pivotable about a second axis perpendicular to the first axis, an end piece of the switch lever bearing a spring-loaded latching sleeve that is engageable into a detent cam at different positions, and the steering column switch further including at least one magnet and at least one magnet sensor that are positionable relative to one another via movements of the switch lever.

BACKGROUND

A magnetic switching system is therefore provided for recognizing the set position of the switch lever. For a steering column switch that includes such a magnetic switching system, a magnet, such as a permanent magnet, is typically either situated at the switch lever or connected to the switch lever, so that the magnet directly follows the swiveling (pivoting) movements of the switch lever.

This type of steering column switch is known from German Patent Publication DE 10 2011 111 871 A1. The steering column switch described in this document provides an actuating lever with a magnet situated thereon, a magnet sensor being situated at each detent (locking) position at a gate (e.g., a connecting link) having a plurality of possible detent positions for the actuating lever.

Due to the plurality of required magnet sensors alone, such a design is relatively complicated. In this steering column switch, the magnet sensors are also situated behind the detent cam, which has an adverse effect on the installed length of the steering column switch.

In addition to a latching system for producing actuation haptics and a switching system (embodied here as a magnet sensor system) for determining the set switching position of the switch lever, many steering column switches also include a trigger system that allows the switch lever to be automatically reset from the switch positions in which the steering column switch functions as a blinker light switch.

Typically, only a limited installation space is available for a steering column switch in a motor vehicle. The above-mentioned systems must therefore be coordinated with one another so that they may all be accommodated in the available installation space.

Because both the trigger system and the latching system do not have many degrees of freedom with regard to their position and arrangement, room for the magnetic switching system must usually be provided to the side of the trigger system and the latching system. The search for a suitable position is often a compromise between installation space requirements and system robustness.

SUMMARY

An object is to provide such a steering column switch with a magnetic switching system that is particularly compact and that influences the other components as little as possible.

In embodiments of the present invention, a steering column switch for a motor vehicle includes a switch lever, a switch piece, a slide, and at least one magnet ("magnet") and at least one magnet sensor ("magnet sensor"). The switch lever can be pivoted in two directions that are perpendicular to each other. The switch piece is pivotally mounted about a first axis. The switch lever is pivotally mounted in the switch piece about a second axis. The second axis is arranged perpendicularly to the first axis. The switch lever has an end piece and a spring-loaded latching sleeve at the end piece. The latching sleeve is latchable into a latching cam at different positions. The slide is movably mounted on the switch piece in a linear manner parallel to the first axis. The magnet is rigidly connected to the slide. The magnet and the magnet sensor can be positioned relative to each other by pivoting the switch lever about the second axis. The magnet pivots together with the switch piece when the switch piece is pivoted about the first axis thereof.

Embodiments of the present invention achieve the above object and/or other objects in that the magnet is fixedly connected to a slide, the slide is mounted on the switch piece so that the slide is linearly displaceable parallel to the first axis and follows the pivoting movements of the switch lever about the second axis, and the magnet swivels together with the switch piece during swivel movements of the switch piece about the first axis.

The magnetic switching system proposed here is thus linearly guided in one direction. In contrast, many known switching systems operate with rotation in both the horizontal and the vertical switching directions of the switch lever.

Due to its design, the proposed magnetic switching system may be arranged in such a way that it has little or no effect on the other systems, and the magnetic switching system itself is likewise not limited by other systems.

In this regard, it is advantageous when the slide has a frame-like design and includes a recess through which the latching sleeve is guided.

It is likewise advantageous that at least a portion of a trigger system, that is suitable for returning the switch lever from an actuated switching position, may be guided through the recess.

The magnetic switching system can "reach around" the trigger system, and together with its sensor system may be situated below the latching system. As a result of this arrangement, the magnetic switching system may be optimized with regard to robustness, largely uninfluenced by the other systems.

Furthermore, the design and the control of the magnetic switching system according to embodiments of the present invention also provide the advantage of additional degrees of freedom in positioning the magnetic switching system. Whereas known systems allow only a limited orientation or alignment, without addressing sometimes significant disadvantages in the evaluation, the sensor system of the magnetic switching system according to embodiments of the present invention may be arranged so that the sensor system is freely rotatable about the first swivel axis of the switching piece, without impairing the quality of the evaluation.

It is advantageous to provide that the slide is coupled to the switch lever by means of a reversing lever that is rotatably mounted on the switch piece. As a result, the reversing lever transfers movements of the switch lever about the second axis to the slide via a lever transmission.

BRIEF DESCRIPTION OF THE DRAWINGS

Exemplary embodiments of a steering column switch in accordance with the present invention are illustrated and explained in greater detail below with reference to the drawings, which include the following.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
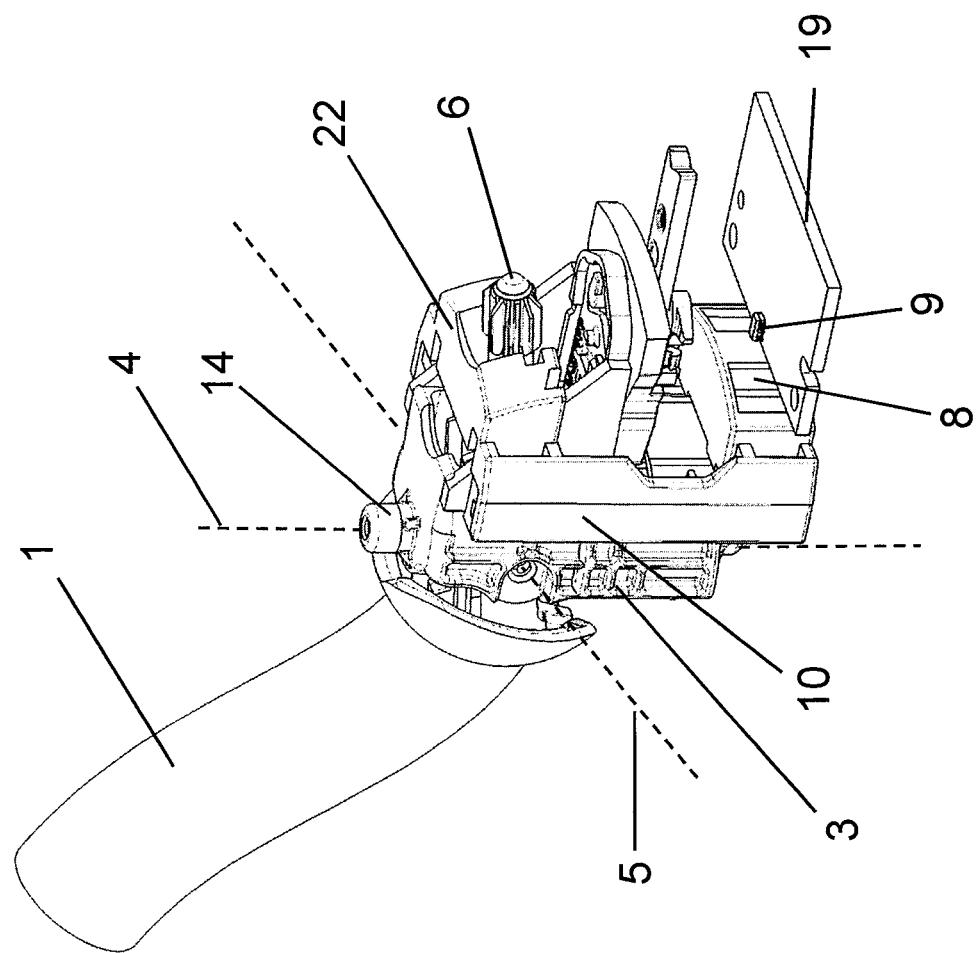
FIGS. 1, 2, and 3 respectively illustrate a top view, an exploded view, and a sectional view of a steering column switch in accordance with a first embodiment of the present invention.
Figure 2:
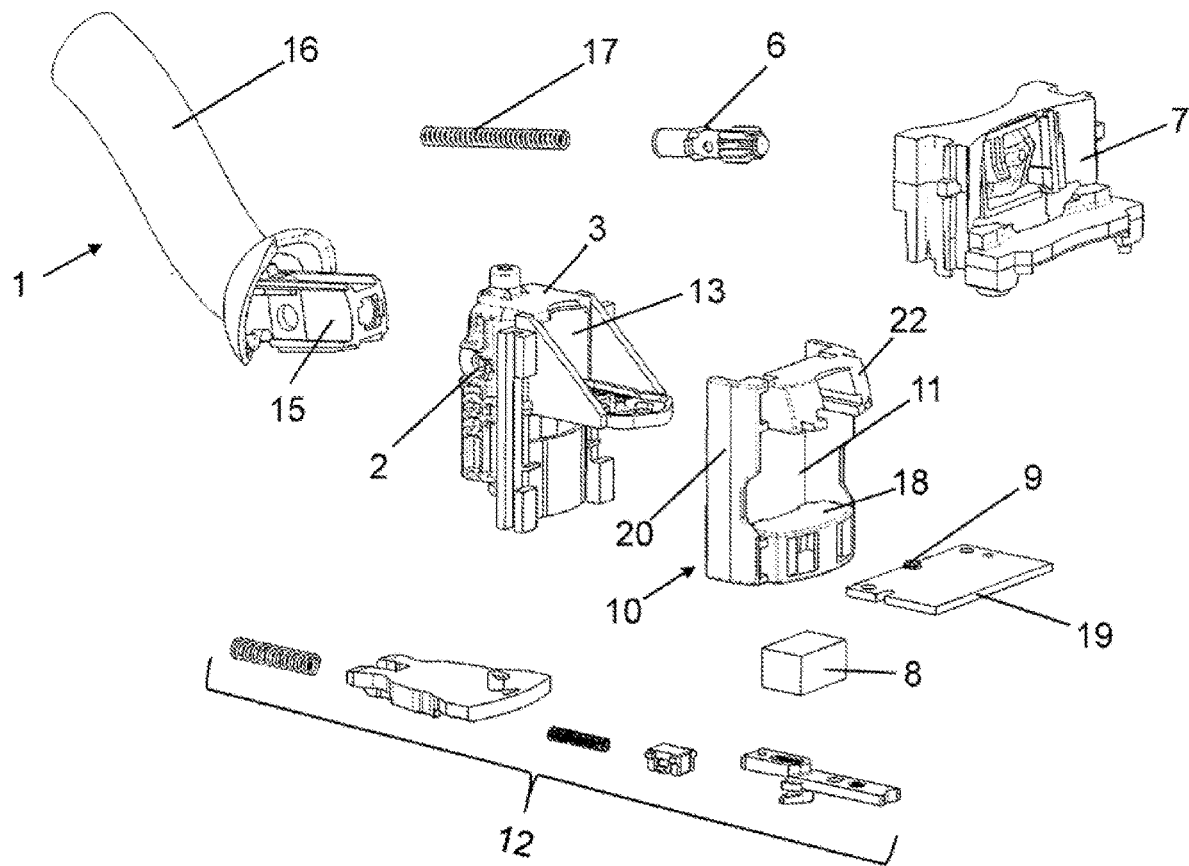
Figure 3:
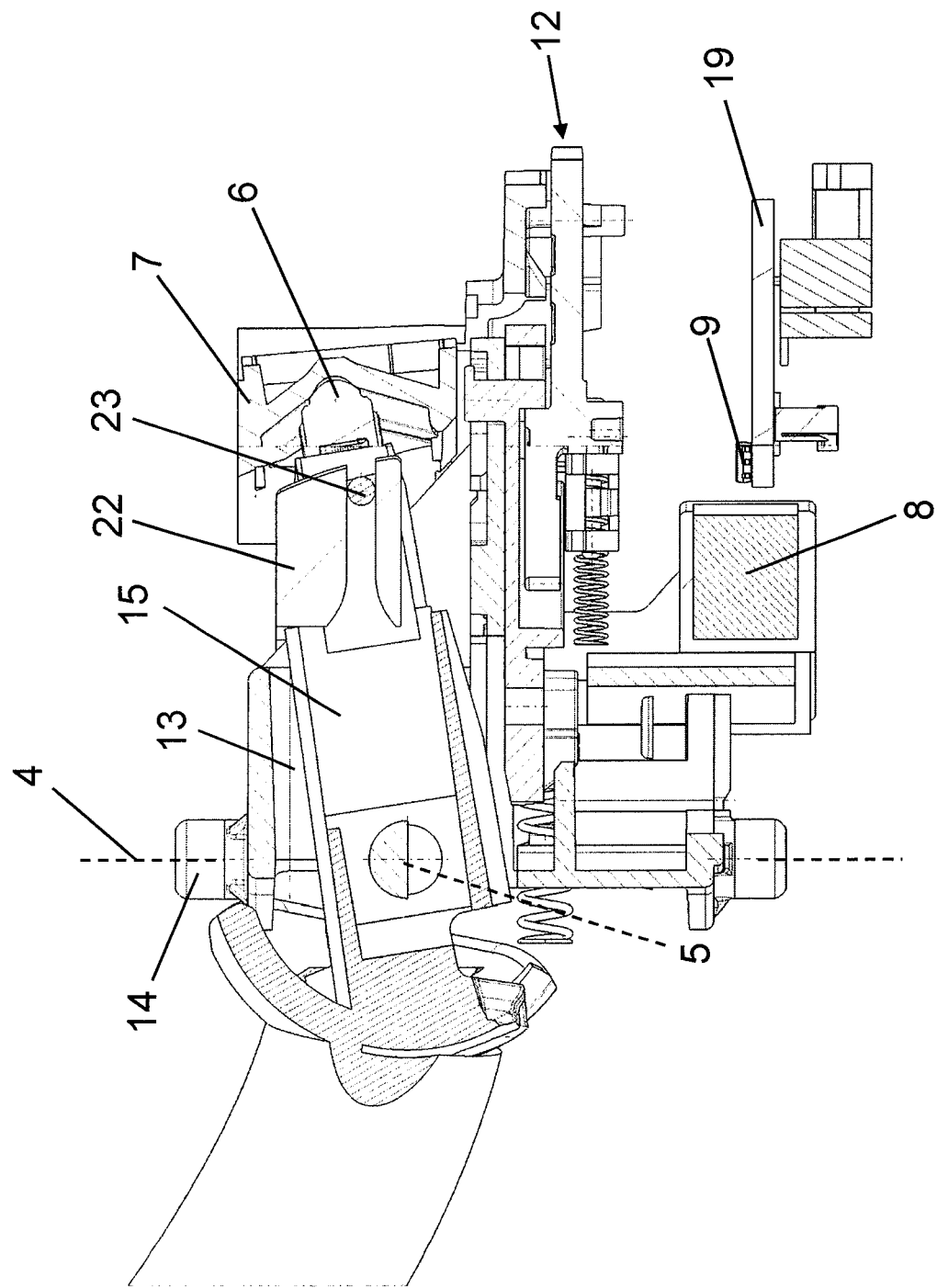

Referring now to FIGS. 1, 2, and 3, a steering column switch in accordance with a first embodiment of the present invention will be described. FIGS. 1, 2, and 3 respectively illustrate a top view, an exploded view, and a sectional view of the steering column switch.

The steering column switch includes a switch lever 1, a switch piece 3, a slide 10, and at least one magnet ("magnet") 8 and at least one magnet sensor ("magnet sensor") 9. Switch lever (or shift lever or shifter) 1 is pivotable in two directions that are perpendicular to each other. Switch piece (or switching piece or contact piece) 3 is pivotally mounted about a first axis 4. Switch lever 1 is pivotally mounted in switch piece 3 about a second axis 4. Second axis 4 is arranged perpendicularly to first axis 3.

Switch lever 1 has an end piece 15. A spring-loaded latching sleeve 6 is at end piece 15. Latching sleeve (or locking sleeve) 6 is latchable (or lockable) into a latching cam (or locking cam) 7 at different positions.

Slide (or carriage) 10 is movably mounted on switch piece 3 in a linear manner parallel to first axis 4. Magnet 8 is rigidly connected to slide 10. Magnet 8 and magnet sensor 9 can be positioned relative to each other by pivoting switch lever 1 about second axis 5. Magnet 8 pivots together with switch piece 3 when the switch piece is pivoted about first axis 4 thereof.

FIG. 1 shows the steering column switch without detent cam 7, which is illustrated in FIGS. 2 and 3. The following description refers to all of the Figures collectively.

Contact piece 3 includes axle stubs, as bearing points 14, integrally formed thereon at two mutually opposite outer surfaces. In the fully installed or fully assembled state, the axle stubs as bearing points 14 are inserted into recesses of a housing (not shown). As a result, switch piece 3 is mounted so as to be pivotable (swivel-able) about first axis 4. The housing may be situated in particular at the steering column of a motor vehicle, or even provided as an integral part of the steering column.

Switch piece 3 has an opening 13. Two bearing points 2 are situated at the side of opening 13. Switch lever 1 is mounted to bearing points 2 so as to be pivotable about second axis 5. End piece 15 of switch lever 1 passes through opening 13 of switch piece 3.

A trigger system 12 made up of multiple components is situated on switch piece 3 below opening 13. The function of trigger system (or release system) 12 is to return switch lever 1 from a deflected position into a normal position. The operating principle of trigger system 12 is not described in detail here, as it is basically known and is not essential to understanding the present invention. The basic operating principle of a trigger system is explained in German Utility Model DE 81 12 331 U1, for example.

End piece 15 is fixedly connected to a handle 16 of switch lever 1. Handle 16 is provided for manual actuation of switch lever 1. Via movements of handle 16 in different directions, firstly, switch piece 3 may be swiveled about first axis 4, and secondly, switch lever 1 may be pivoted within switching piece 3 about second axis 5. Bearing points 2 for switch lever 1 are arranged in relation to bearing points 14 of switch piece 3 in such a way that first axis 4 and second axis 5 are oriented perpendicularly with respect to one another.

Latching sleeve 6 is situated within a borehole in end piece 15 and is acted on by a compression spring 17. Latching sleeve with its tip rests against detent cam 7, where the latching sleeve may engage at multiple positions. These positions, which switch lever 1 may assume at detent cam 7 either stably or unstably, define the possible switching positions of switch lever 1.

The switching position of switch lever 1 which is set at that point in time is determined by a magnetic sensor system. For this purpose, the position of magnet 8 relative to magnet sensor 9 is detected by evaluation of the signals of magnet sensor 9 by an electronics system (not shown).

According to the present invention, it is provided that magnet 8 is fixedly connected to a slide 10 that is mounted on switching piece 3 so that the slide is linearly displaceable parallel to first axis 4 and follows the movements of switch lever 1 about second axis 5, and during swivel movements of switching piece 3 is swiveled about first axis 4.

For this purpose, slide 10 has a frame-like design, and has a recess 11 through which latching sleeve 6 and portions of trigger system 12 are guided. Due to the frame-like design, slide 10 is compact and requires only a small mounting space on switch piece 3.

Slide 10 has two mutually parallel side parts 20 that are connected to slide grooves 21, integrally formed on switch piece 3, to form a sliding guide. For this purpose, guide elements that are integrally formed on the inner sides of side parts 20 are inserted into slide grooves 21. The guide elements, not discernible in the Figures, may be designed in particular in the form of short pins. In the upper portion of slide 10, side parts 20 are connected to a crossmember 22 that is coupled to end piece 15 of switch lever 1 via an entraining element (or driver element) 23.

The lower portion of slide 10 is formed by a magnet holder 18. Magnet holder 18 bears magnet 8. Magnet 8 may be adhesively bonded or injection-molded into magnet holder 18. Magnet holder 18 may either be designed in one piece with the side parts 20 of slide 10 or, as illustrated in the Figures, manufactured as an individual part that is connected to side parts 20 of slide 10, for example by locking (or latching).

A circuit board 19 is fixedly situated relative to the housing (not shown). Magnet sensor 9 is situated on circuit board 19. Movements of magnet 8 are detected by magnet sensor 9. Magnet sensor 9, which preferably may be designed as a Hall sensor that measures in three dimensions, detects the intensity and the direction of the magnetic field passing through it, and may thus distinguish between linear movements and swivel (pivotal) movements of slide 10.

In principle, the magnetic sensor system may also have a reverse kinematic design, so that magnet sensor 9 is fixedly situated on slide 10, and magnet 8 is fixedly situated relative to the housing. However, the design illustrated in the Figures is preferred, since no movable connecting lines for magnet sensor 9 are required.

The orientation of magnet 8 with respect to magnet sensor 9, as illustrated in the Figures, does not have to be in the longitudinal direction of the steering column switch, i.e., essentially parallel to latching sleeve 6. Instead, an arrangement of magnet holder 18 on slide 10 which is rotated about first axis 4 may be provided, the orientation of magnet sensor 9 being correspondingly adapted.

Such a rotated orientation of the switching system has no effect on the evaluation but provides increased flexibility in the design of the steering column switch.

Figure 4:
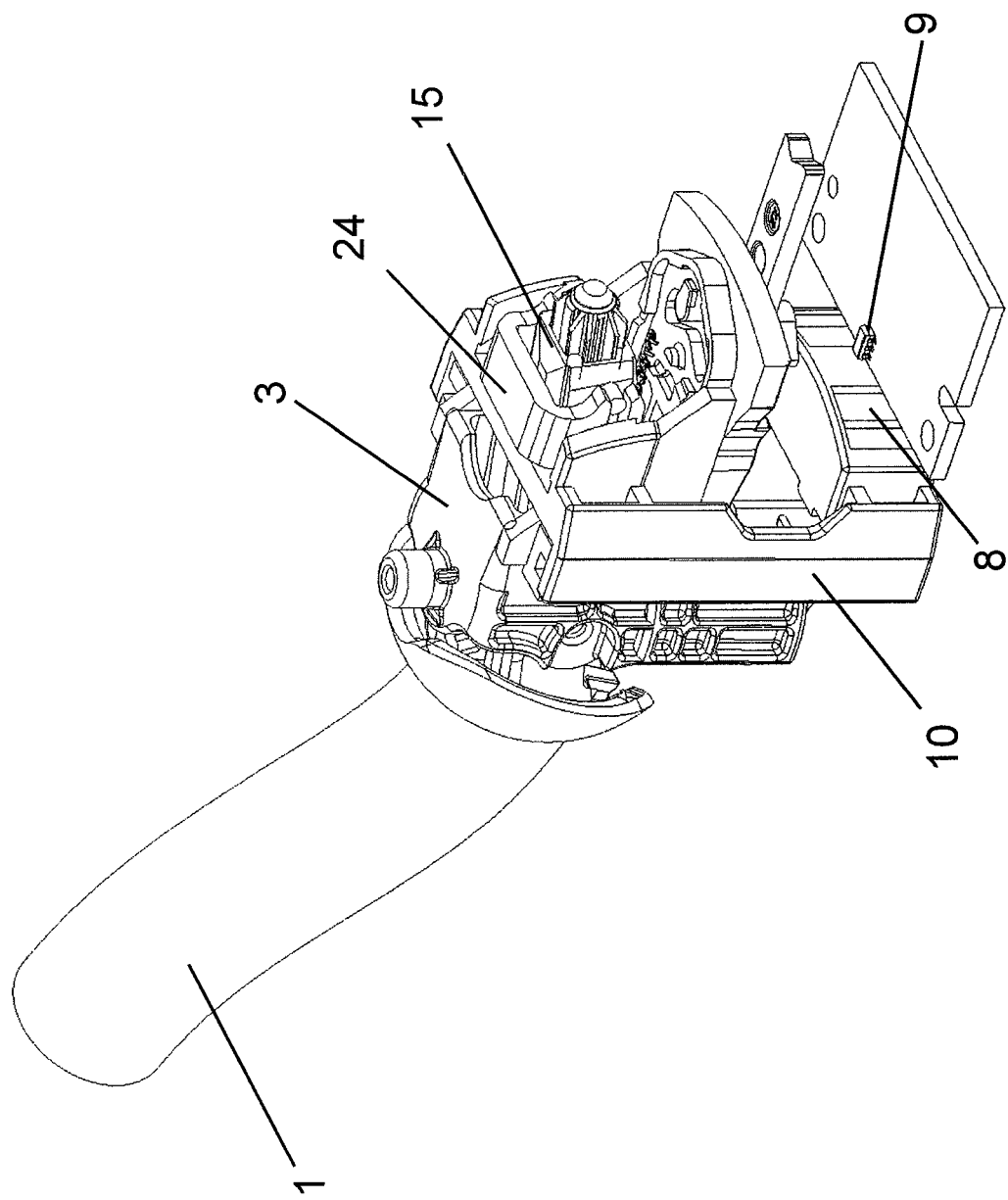
FIGS. 4, 5, and 6 respectively illustrate a top view, an exploded view, and a sectional view of a steering column switch in accordance with a second embodiment of the present invention.
Figure 5:
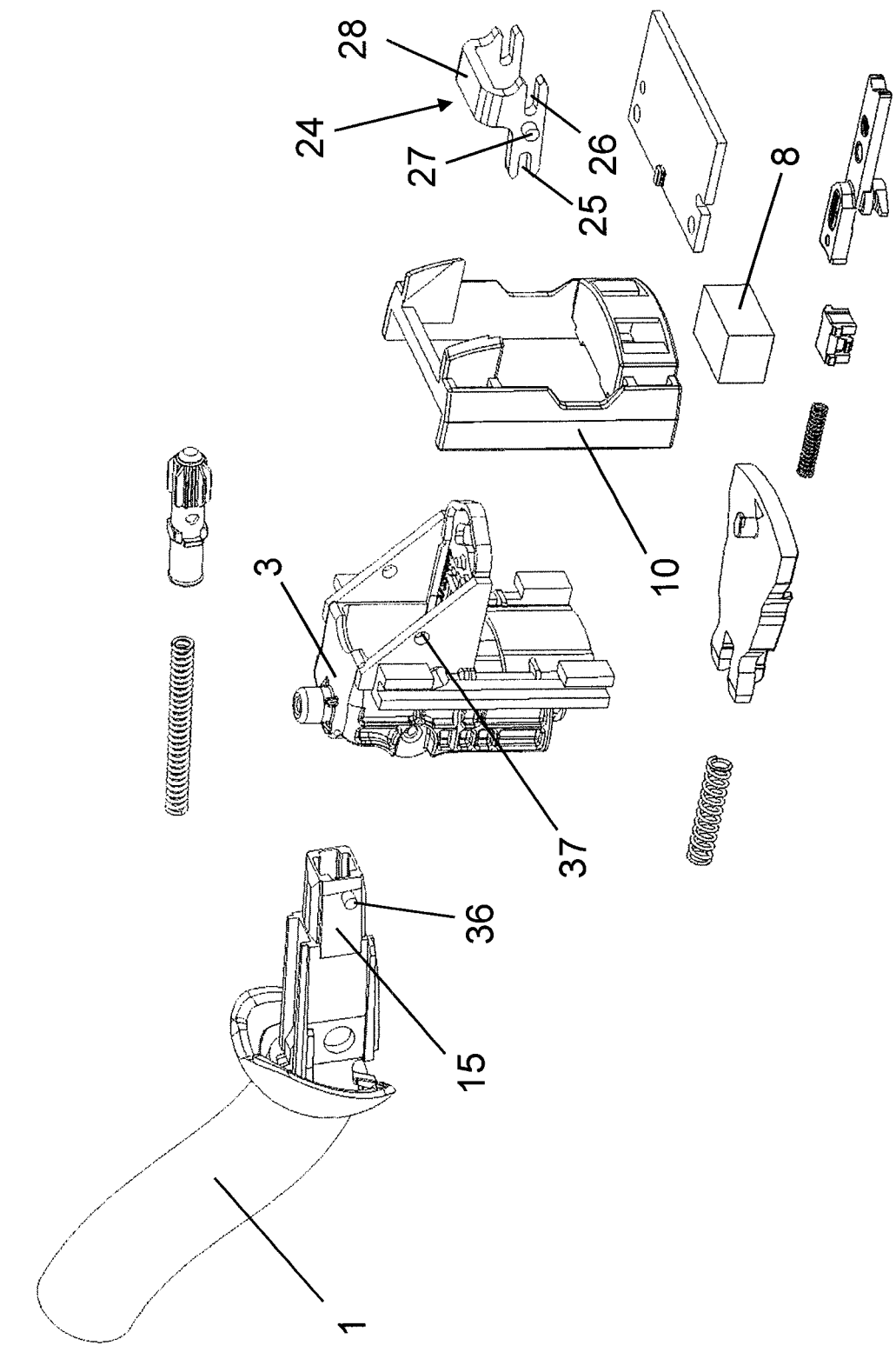
Figure 6:
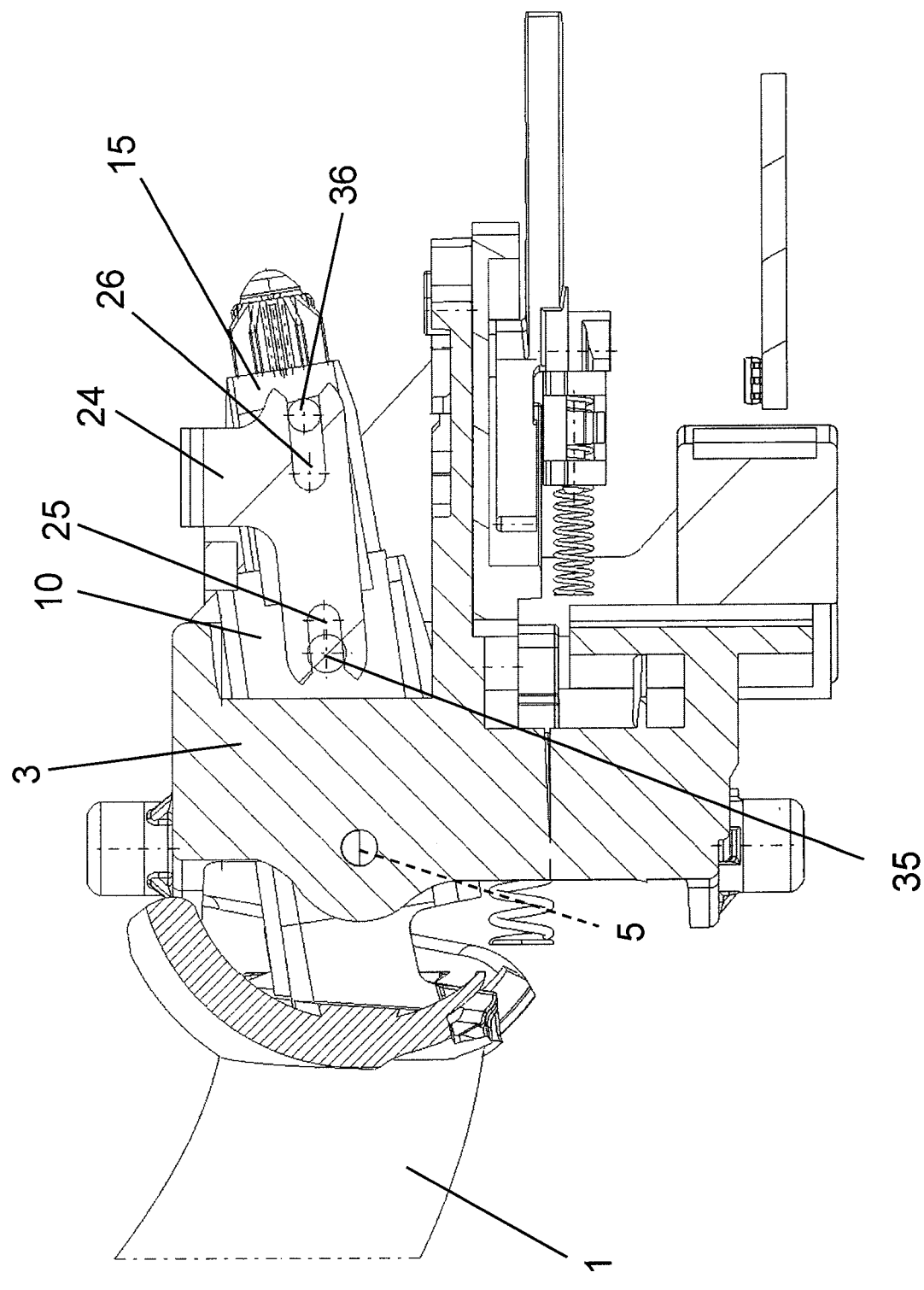

Referring now to FIGS. 4, 5, and 6, with continual reference to FIGS. 1, 2, and 3, a steering column switch in accordance with a second embodiment of the present invention will be described. FIGS. 4, 5, and 6 respectively illustrate a top view, an exploded view, and a sectional view of the steering column switch.

In many details, the design of this second exemplary embodiment matches that of the first exemplary embodiment described with reference to FIGS. 1, 2, and 3; therefore, repetition of the explanation of the previously described details may be dispensed with here. The following description therefore relates primarily to the features that distinguish the two embodiments. Reference numerals introduced for the first exemplary embodiment are retained for identical and functionally equivalent parts.

A characteristic of the second embodiment is that slide 10 is coupled to switch lever 1 with the aid of a reversing lever 24 that is rotatably mounted on switch piece 3. Reversing lever 24 transfers movements of switch lever 1 about second axis 5 to slide 10 via a lever transmission. That is, slide 10 is coupled to switch lever 1 by means of reversing lever 24 rotatably mounted on switch piece 3, whereby reversing lever 24 moves switch lever 1 about second axis 5 with a leverage ratio transferred to slide 10.

Reversing lever 24 is particularly apparent as an individual part in FIG. 5. Reversing lever 24 is made up of a connecting bridge 28 onto which mutually parallel first and second elongated hole guides 25 and 26 and a bearing pin 27 situated therebetween are integrally formed.

Bearing pins 27 are inserted into bearing recesses 37 at switch piece 3. As a result, reversing lever 24 is rotatably mounted on switch piece 3. Molded-on first guide pins 35, one of which is discernible in FIG. 6, engage with first elongated hole guides 25 at slide 10. Second elongated hole guides 26 of reversing lever 24 cooperate with second guide pins 36 at end piece 15 of switch lever 1. Reversing lever 24 thus forms a two-armed lever in the physical sense.

The swiveling of switch lever 1 about second axis 5 thus causes swiveling of reversing lever 24, and at the same time, displacement of slide 10 that is coupled to reversing lever 24. Slide 10 moves oppositely with respect to end piece 15 of switch lever 1, or more precisely, corresponding to the movement direction of handle 6 of switch lever 1.

For the functional performance of the overall switching system, it is important that magnet 8 assumes a unique position in each switching position that is different enough from all other positions so that magnet 8 may be reliably detected by magnet sensor 9.

For a swivel movement of switch lever 1 about second axis 5, the achievable lift of slide 10 upon direct entrainment by switch lever 1, as illustrated in FIGS. 1, 2, and 3, is directly dependent on the switching movement of switch lever 1. Swiveling of switch lever 1 about a small angle thus results in a slight lift of slide 10, and thus also of magnet 8.

If the swivel movement of switch lever 1 about second axis 5 is too small, then a sufficient lift of magnet 8 is not achieved in order to reliably recognize its positions and distinguish them from other positions.

According to the second embodiment, with the aid of reversing lever 24, small swivel movements of switch lever 1 may be correspondingly transmitted and thus augmented. Small swivel movements of switch lever 1 may thus bring about a relatively large lift of slide 10 and of magnet 8 situated thereon.

Thus, the linear movement of slide 10 is no longer dependent solely on the swivel movement of switch lever 1, but, rather, is also determined by the transmission ratio achieved by reversing lever 24.

LIST OF REFERENCE NUMERALS

1 switch lever (shift lever; shifter)
2 bearing points
3 switch piece (switching piece; contact piece; switch body)
4 first axis
5 second axis
6 latching sleeve (locking sleeve)
7 detent cam (locking curve)
8 magnet
9 magnet sensor
10 slide (carriage)
11 recess
12 trigger system (release system)
13 opening
14 bearing points
15 end piece
16 handle
17 compression spring
18 magnet holder
19 circuit board
20 side parts (side panels)
21 slide grooves
22 crossmember
23 entraining element (driver element)
24 reversing lever
25 first elongated hole guides (first slot guides)
26 second elongated hole guides (second slot guides)
27 bearing pins
28 connecting bridge (connecting bar)
35 first guide pins
36 second guide pins
37 bearing recesses While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A steering column switch for a motor vehicle, comprising:
   a switch lever pivotable in two mutually perpendicular directions;
   a switch body pivotable about a first axis;
   the switch lever having an end piece, the end piece of the switch lever being pivotably mounted in the switch body so that the switch lever is pivotable about a second axis perpendicular to the first axis, the end piece of the switch lever bearing a spring-loaded latching sleeve that is engageable into a detent cam at different positions;
   a slide mounted on the switch body so that the slide is linearly displaceable parallel to the first axis and follows movement of the switch lever about the second axis; and
   a magnet and a magnet sensor that are positionable relative to one another via movements of the switch lever, the magnet being fixedly connected to the slide and swivels together with the switch body during swivel movements of the switch body about the first axis.

2. The steering column switch of claim 1 further comprising:
   a reversing lever rotatably mounted on the switch body; and
   the slide being coupled to the switch lever by the reversing lever.

3. The steering column switch of claim 1 wherein:
   the slide has a frame like design and includes a frame including a recess through which the latching sleeve is guided.

4. The steering column switch of claim 3 further comprising:
   a trigger system configured to return the switch lever from an actuated switching position, at least a portion of the trigger system being guided through the recess.

5. A steering column switch, comprising:
   a switch lever;
   a switch body pivotable about a first axis;
   the switch lever being pivotably mounted in the switch body so that the switch lever is pivotable about a second axis perpendicular to the first axis;
   a slide mounted on the switch body so that the slide linearly displaces parallel to the first axis in correspondence with swiveling movements of the switch lever about the second axis; and
   a magnet fixedly connected to the slide so that the magnet moves together with the slide parallel to the first axis in correspondence with swiveling movements of the switch lever about the second axis, and the magnet moves together with the switch body about the first axis in correspondence with swiveling movements of the switch body about the first axis.

6. The steering column switch of claim 5 further comprising:
   a reversing lever rotatably mounted on the switch body; and
   the slide being coupled to the switch lever by the reversing lever.

7. The steering column switch of claim 5 further comprising:
   a magnet sensor fixedly situated relative to the magnet.

8. A steering column switch for a motor vehicle, comprising:
   a switch lever pivotable in two mutually perpendicular directions;
   a switch body pivotable about a first axis;
   the switch lever having an end piece, the end piece of the switch lever being pivotably mounted in the switch body so that the switch lever is pivotable about a second axis perpendicular to the first axis, the end piece of the switch lever bearing a spring-loaded latching sleeve that is engageable into a detent cam at different positions;
   a slide mounted on the switch body so that the slide is linearly displaceable parallel to the first axis and follows movement of the switch lever about the second axis; and
   a magnet and a magnet sensor that are positionable relative to one another via movements of the switch lever, the magnet sensor being fixedly connected to the slide and swivels together with the switch body during swivel movements of the switch body about the first axis.

* * * * *